US008013511B2

(12) United States Patent
Takeuchi et al.

(10) Patent No.: US 8,013,511 B2
(45) Date of Patent: Sep. 6, 2011

(54) HIGHLY-EFFICIENT ELECTRON-EMITTING DEVICE AND IMAGE DISPLAY APPARATUS HAVING A SUBSTRATE WITH A DISTRIBUTION OF NITROGEN CONTAINING RATIO

(75) Inventors: Eiji Takeuchi, Atsugi (JP); Takeo Tsukamoto, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 200 days.

(21) Appl. No.: 12/463,715

(22) Filed: May 11, 2009

(65) Prior Publication Data

US 2009/0284127 A1 Nov. 19, 2009

(30) Foreign Application Priority Data

May 14, 2008 (JP) ................................ 2008-126628

(51) Int. Cl.
*H01J 1/30* (2006.01)
*H01L 29/02* (2006.01)

(52) U.S. Cl. ........ 313/495; 313/496; 313/497; 313/309; 313/310

(58) Field of Classification Search ........................ None
See application file for complete search history.

(56) References Cited

U.S. PATENT DOCUMENTS

2002/0084736 A1 7/2002 Shibata ......................... 313/310
2005/0236965 A1* 10/2005 Yamamoto et al. ........... 313/496
2005/0287689 A1 12/2005 Iwaki et al. ..................... 438/22
2007/0188067 A1 8/2007 Tsukamoto et al. .......... 313/309
2007/0252129 A1* 11/2007 Yagi ................................. 257/2
2009/0237570 A1 9/2009 Moriguchi et al. ........... 348/725

FOREIGN PATENT DOCUMENTS

JP 09-293448 A 11/1997

OTHER PUBLICATIONS

European Search Report issued in the counterpart application No. 09160122.9 dated Jul. 1, 2010—5 pages.

* cited by examiner

*Primary Examiner* — Anne Hines
*Assistant Examiner* — Tracie Green
(74) *Attorney, Agent, or Firm* — Fitzpatrick, Cella, Harper & Scinto

(57) ABSTRACT

An electron-emitting device has a pair of device electrodes formed on a substrate and an electroconductive film connected to the device electrodes. The electroconductive film has a first gap between the device electrodes and has a carbon film having a second gap at least in the first gap. The substrate is formed by stacking a nitrogen-contained activation suppressing layer and an activation accelerating layer having a nitrogen containing ratio smaller than that of the activation suppressing layer onto a base and has nitrogen containing ratio distribution in the activation suppressing layer in a film thickness direction. The nitrogen containing ratio of the activation suppressing layer at the activation accelerating layer side is smaller than that at the base side.

8 Claims, 6 Drawing Sheets

HIGHLY-EFFICIENT ELECTRON-EMITTING DEVICE AND IMAGE DISPLAY APPARATUS HAVING A SUBSTRATE WITH A DISTRIBUTION OF NITROGEN CONTAINING RATIO

BACKGROUND OF THE INVENTION

1. Field of the Invention

The present invention relates to an electron-emitting device and an image display apparatus using the electron-emitting devices.

2. Description of the Related Art

As an electron-emitting device, there is an electron-emitting device of a field emission type, a surface conduction type, or the like.

As a step of forming the surface conduction electron-emitting device, first, a pair of device electrodes is formed onto an insulating substrate. Subsequently, the pair of device electrodes is connected through an electroconductive film. By applying a voltage between the device electrodes, a process called "energization forming" for forming a first gap into a part of the electroconductive film is executed. The energization forming operation is a step of supplying a current to the electroconductive film and forming the first gap into a part of the electroconductive film by a Joule heat generated by the current. By the energization forming operation, a pair of electroconductive films which face through the first gap is formed. Subsequently, a process called "activation" is executed. The activation operation is a process for applying a voltage between the pair of device electrodes in an atmosphere of a carbon-containing gas. Thus, electroconductive carbon films can be formed onto the substrate in the first gap and the electroconductive films near the first gap. Thus, the electron-emitting device is formed.

When an electron is emitted from the electron-emitting device, an electric potential which is applied to one of the device electrodes is set to be higher than an electric potential which is applied to the other device electrode. By applying the voltage between the device electrodes as mentioned above, a strong electric field is caused in a second gap. It is, consequently, considered that electrons tunnel from a number of portions (a plurality of electron-emitting regions) in a portion forming an outer edge of the second gap corresponding to an edge of the carbon film connected to the device electrode on the low potential side and a part of the electrons are emitted.

As for the electron-emitting device, it is demanded to improve stable electron-emitting characteristics and an electron-emitting efficiency so that an image display apparatus using the electron-emitting devices can stably provide a bright display image. The efficiency used here is evaluated by a ratio of a current flowing between a pair of device electrodes of the surface conduction electron-emitting device (hereinbelow, referred to as a "device current") when a voltage is applied between the device electrodes and a current which is emitted into a vacuum (hereinbelow, referred to as an "electron emission current"). Therefore, the electron-emitting device in which the device current is small and the emission current is large is demanded. If the electron-emitting characteristics and efficiency which can be stably controlled are improved, for example, in an image display apparatus using phosphor as an image forming member, a high-quality image display apparatus which is bright at a low current such as a flat panel television can be realized. In association with the realization of the low current, costs of a driving circuit and the like constructing the image display apparatus can be also reduced.

When an activation time extends, an emission current amount of the surface conduction electron-emitting device decreases contrarily. Initial emission currents of the respective electron-emitting devices are not substantially uniform and the devices show different activation characteristics due to such causes that a gas pressure during the activation differs depending on a location and the like. That is, when the activation is executed at the same time, the devices have a variation in efficiency. Therefore, in the case where the image display apparatus is constructed by using a plurality of surface conduction electron-emitting devices, there is such a problem that if the efficiencies of the electron-emitting devices are not uniform, the electron emission amount changes depending on the position of the device or a luminance fluctuation occurs.

In Japanese Patent Application Laid-Open No. H09-293448, there has been disclosed such a construction that an activation suppressing layer is formed onto an insulating substrate, an activation accelerating layer is further stacked onto the activation suppressing layer, and an electron-emitting device is formed, thereby suppressing a deterioration in characteristics due to the over-activation and uniforming the activation in an activating step.

However, in the electron-emitting device disclosed in Japanese Patent Application Laid-Open No. H09-293448, there is such a problem that a device current (leakage current) flowing in a substrate occurs due to the existence of the activation suppressing layer and the efficiency deteriorates.

SUMMARY OF THE INVENTION

It is an object of the invention to provide an electron-emitting device of a low electric power consumption and a high efficiency in which a leakage current is reduced.

Further, in an image display apparatus using a plurality of such electron-emitting devices, it is another object of the invention to provide an image display apparatus in which electron-emitting characteristics of the respective devices are uniform, a uniform luminance is obtained, and an excellent operation stability is obtained.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

According to the first invention, there is provided an electron-emitting device comprising at least: a pair of device electrodes formed on a substrate; and an electroconductive film formed so as to connect the device electrodes, wherein the electroconductive film has a first gap between the device electrodes and has a carbon film having a second gap at least in the first gap, the substrate is constructed by stacking an activation suppressing layer containing nitrogen and an activation accelerating layer whose nitrogen containing ratio is smaller than that of the activation suppressing layer onto a base and has distribution of the nitrogen containing ratio in the activation suppressing layer in a film thickness direction, and the nitrogen containing ratio of the activation suppressing layer at the activation accelerating layer side is smaller than that at the base side.

The electron-emitting device of the invention incorporates, as an exemplary embodiment, such a construction that the activation suppressing layer contains one of silicon nitride, aluminum nitride, and tantalum nitride and the activation accelerating layer is made of $SiO_2$ or glass containing $SiO_2$ as a main component.

According to the second invention, there is provided an image display apparatus in which a first substrate on which the plurality of electron-emitting devices of the invention are arranged and a second substrate on which image display members to which electrons emitted from the electron-emitting devices are irradiated are arranged in opposition to the electron-emitting devices are arranged so as to face each other.

According to the invention, by allowing the nitrogen containing ratio of the activation suppressing layer to have the distribution in the film thickness direction, a progress of the activation is suppressed in the activation suppressing layer and the leakage current is reduced, so that the activation becomes uniform and the high-efficient electron-emitting device is obtained. Therefore, in the image display apparatus of the invention, a display of a uniform luminance having excellent operation stability can be performed at a low electric power consumption.

According to the electron-emitting device of the invention, the construction in which the activation suppressing layer and the activation accelerating layer are stacked onto the base is used as a substrate, further, the activation suppressing layer contains nitrogen, and the nitrogen containing ratio of the activation suppressing layer at the activation accelerating layer side is smaller than that at the base side.

An embodiment of the invention will be described hereinbelow with reference to the drawings.

Figure 1A:
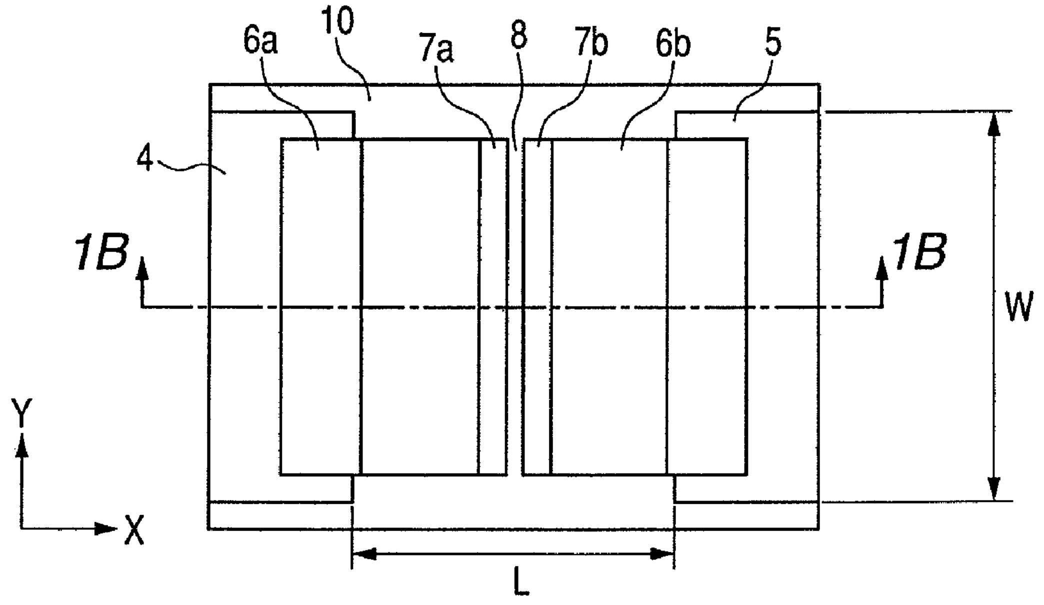
FIGS. 1A and 1B are schematic diagrams illustrating a construction of an embodiment of an electron-emitting device of the invention.
Figure 1B:
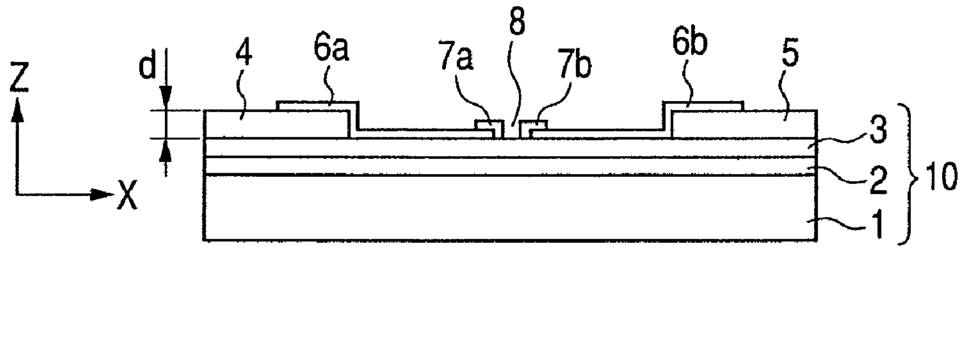

FIGS. 1A and 1B are diagrams illustrating the embodiment of an electron-emitting device to which the invention can be applied. FIG. 1A is a schematic plan view. FIG. 1B is a schematic cross sectional view taken along the line 1B-1B in FIG. 1A. FIGS. 2A to 2D are schematic cross sectional views illustrating producing steps of the electron-emitting device. In FIGS. 1A and 1B and 2A to 2D, a base 1 is illustrated. An activation suppressing layer 2 is formed on the base 1. An activation accelerating layer 3 is formed on the activation suppressing layer 2. Device electrodes 4 and 5 are formed on the activation accelerating layer 3. Electroconductive films 6*a* and 6*b* are arranged so as to face each other through a gap 9 (first gap). Carbon films 7*a* and 7*b* are arranged so as to face each other through a gap 8 (second gap). An insulating substrate 10 is constructed by stacking the activation suppressing layer 2 and the activation accelerating layer 3 onto the base 1.

In the invention, an insulating material such as quartz glass, glass in which a containing amount of impurities of Na or the like has been reduced, soda lime glass, ceramics such as alumina, Si substrate, or the like can be used as the base 1.

Although the activation suppressing layer 2 which is used in the invention is an insulating layer containing nitrogen, an insulating material obtained by mixing at least one kind of nitrides such as silicon nitride, aluminum nitride, and tantalum nitride into $SiO_2$ can be desirably used.

The activation suppressing layer 2 according to the invention has distribution of the nitrogen containing ratio in the film thickness direction. Specifically speaking, the layer 2 can have a construction in which the nitrogen containing ratio decreases continuously from the base 1 side toward the activation suppressing layer 2 side or a stacked construction of two or more layers in which the nitrogen containing ratio decreases step by step.

The activation accelerating layer 3 is an insulating layer whose nitrogen containing ratio is smaller than that of the activation suppressing layer 2 and is, desirably, an insulating layer which does not contain nitrogen. Specifically speaking, $SiO_2$ or glass containing $SiO_2$ as a main component (containing $SiO_2$ of 50 mass % or more) is desirable.

An ordinary thin film forming method can be adopted as a forming method of the activation suppressing layer 2 and the activation accelerating layer 3. That is, a vacuum evaporation depositing method, a sputtering method, a CVD method, a sol-gel method, or the like is used.

It is considered that there is no upper limit of the thickness of activation suppressing layer 2. However, if the activation accelerating layer 3 is too thick, since an effect of the activation suppressing layer 2 of the lower layer is hidden, a thickness of activation accelerating layer 3 is set to, desirably, 0.2 μm or less and, much desirably, 0.1 μm or less.

In the invention, the activation accelerating layer 3 is a layer in which the activation can be performed due to its existence and the activation suppressing layer 2 is a layer in which an activation speed is reduced due to such a layer. Although it is unclear to determine whether such a phenomenon that the activation can be easily performed by which physical properties or not, there is such a tendency that it is difficult to activate in the material having the large nitrogen containing ratio.

A general conductive material can be used as a material of the device electrodes 4 and 5 which face each other. For example, a print conductor constructed by a metal such as Ni, Cr, Au, Mo, W, Pt, Ti, Al, Cu, or Pd or an alloy thereof, and a metal such as Pd, Ag, Au, $RuO_2$, or Pd—Ag or a metal oxide thereof, and glass or the like can be used. A transparent conductor such as $In_2O_3$—$SnO_2$, a semiconductor material such as polysilicon, or the like can be also used.

An interval L between the device electrodes 4 and 5 and a length W and a thickness d of each of them are designed in consideration of a form or the like which is applied. The interval L between the device electrodes can be set to a value within, desirably, a range from 500 nm to 500 μm, much desirably, a range from 5 μm to 50 μm in consideration of a voltage which is applied between the device electrodes or the like. The length W of each device electrode can be set to a value within a range from 5 μm to 500 μm in consideration of a resistance value and electron-emitting characteristics of the electrode. The thickness d of each of the device electrodes 4 and 5 can be set to a value within a range from 50 nm to 5 μm.

It is desirable to use a fine particle film made of fine particles as each of the electroconductive films 6*a* and 6*b* in order to obtain the good electron-emitting characteristics. A thickness of each of the electroconductive films 6a and 6b is properly set in consideration of a step coverage to the device electrodes 4 and 5, a resistance value between the device electrodes 4 and 5, forming conditions, which will be described hereinafter, and the like. Ordinarily, the film thickness is set to a value within, desirably, a range from 1 nm to hundreds of nm and, much desirably, a range from 1 nm to 50 nm. The resistance value Rs is equal to a value within a range from $10^2$ to $10^7 \Omega/\square$. Rs denotes the value which appears when a resistance R obtained by measuring the thin film having a thickness of t, a width of w, and a length of l in the length direction is set to R=Rs(l/w).

As a material constructing the electroconductive films 6a and 6b, a metal such as Pd, Pt, Ru, Ag, Au, Ti, In, Cu, Cr, Fe, Zn, Sn, Ta, W, or Pb or an oxide such as PdO, $SnO_2$, $In_2O_3$, PbO, or $Sb_2O_3$ can be mentioned. A boride such as $HfB_2$, $ZrB_2$, $LaB_6$, $CeB_6$, $YB_4$, or $GdB_4$, a carbide such as TiC, ZrC, HfC, TaC, SiC, or WC, a nitride such as TiN, ZrN, or HfN, a semiconductor such as Si or Ge, carbon, or the like can be also mentioned.

The fine particle film mentioned here is a film obtained by collecting a plurality of fine particles and its fine structure has a state where the fine particles are individually dispersed and arranged or a state where the fine particles are mutually neighboring or overlaid (also including a case where several fine particles are collected and an island-like structure is formed as a whole). A particle size of fine particle lies within a range from 1 nm to 500 nm and, desirably, a range from 1 nm to 20 nm.

The gap 9 between the electroconductive films 6a and 6b is a fissure having a high resistance formed in a part of a continuous electroconductive film 6 as will be described hereinafter, and depends on a film thickness, film quality, and a material of the electroconductive film 6, a method of an energization forming or the like, which will be described hereafter, and the like. There is also a case where electroconductive fine particles whose particle sizes lie within a range from 0.5 nm to 50 nm exist in the gap 9. The electroconductive fine particles contain a part or all of elements of the material constructing the electroconductive films 6a and 6b.

Each of the carbon films 7a and 7b is a deposition film made of carbon and/or carbon compound which is deposited in portions around the gap 9 between the electroconductive films 6a and 6b in an activating step. There is also a case where the electroconductive films 6a and 6b are connected by an extremely small region.

Subsequently, a producing method of the electron-emitting device of the embodiment will be described with reference to FIGS. 2A to 2D.

Figure 2A:
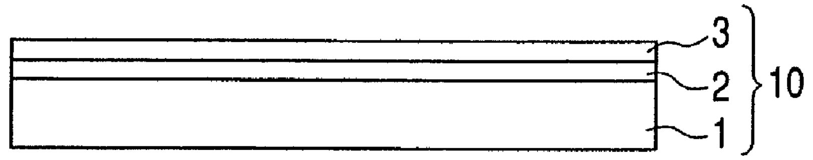
FIGS. 2A, 2B, 2C, and 2D are schematic diagrams illustrating producing steps of the electron-emitting device in FIGS. 1A and 1B.
Figure 2B:
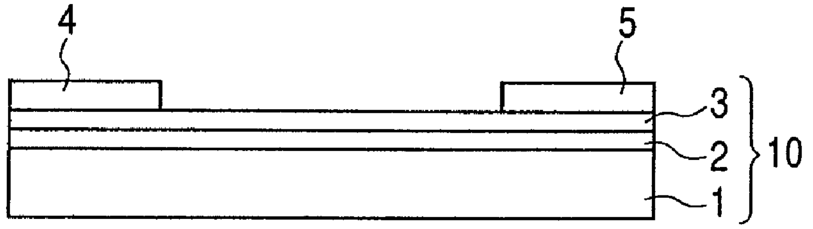

The base 1 is sufficiently cleaned by using a detergent, pure water, an organic solvent, and the like and the activation suppressing layer 2 and the activation accelerating layer 3 are deposited onto the surface of the base 1 by the vacuum evaporation depositing method, the sputtering method, or the like (FIG. 2A). Subsequently, the material of the device electrodes is deposited by the vacuum evaporation depositing method, the sputtering method, or the like and, thereafter, the device electrodes 4 and 5 are formed onto the substrate by using, for example, a photolithography technique (FIG. 2B).

Figure 2C:
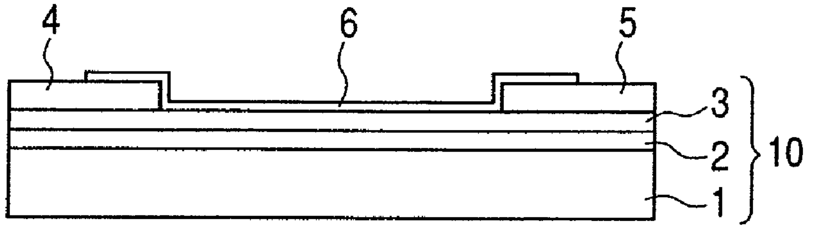

The substrate 10 formed with the device electrodes 4 and 5 is coated with an organic metal solution, thereby forming a thin organic metal film. As an organic metal solution, a solution of an organic metal compound containing the metal of the material of the electroconductive film 6 mentioned above as a main element can be used. The thin organic metal film is heat baking processed and patterned by a lift-off, etching, or the like, thereby forming the electroconductive film 6 (FIG. 2C).

Although the coating method of the organic metal solution has been described here, the forming method of the electroconductive film 6 is not limited to it but the vacuum evaporation depositing method, the sputtering method, a chemical vapor phase depositing method, a dispersion coating method, a dipping method, a spinner method, or the like can be also used.

Subsequently, a forming step for forming the gap 9 into the electroconductive film 6 is executed.

Figure 2D:
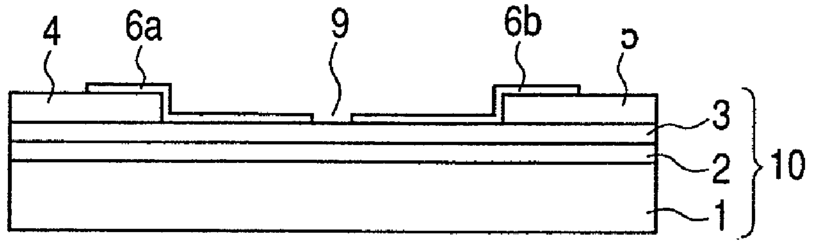
Figure 3:
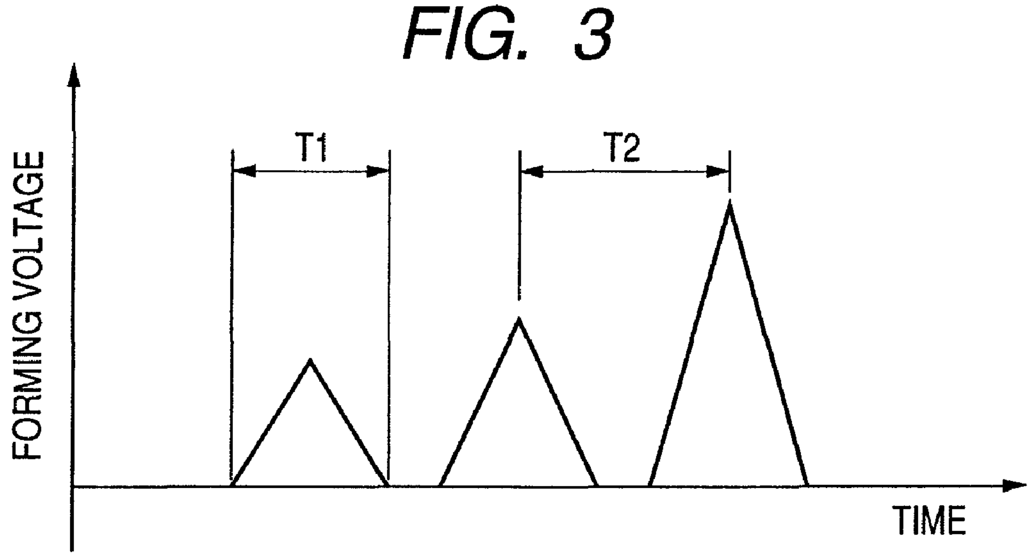
FIG. 3 is a schematic diagram illustrating an example of a voltage waveform which is used in an energization forming operation of the electron-emitting device of the invention.

By applying a predetermined voltage between the device electrodes 4 and 5 and executing the energization forming operation, the gap 9 is formed into the electroconductive film 6 (FIG. 2D). A voltage waveform of the energization forming is illustrated in FIG. 3. A pulse waveform is desirable as a voltage waveform.

A process called an activating step is executed to the device obtained after the forming operation. The activating step is, for example, a process for repetitively applying the pulse voltage to the device under the atmosphere containing organic substance gases. By this process, the carbon films 7a and 7b made of carbon and/or carbon compound are deposited onto the device from the organic substances existing in the atmosphere, so that a device current If and an emission current Ie change remarkably.

The activating step can be executed, for example, by repetitively applying a pulse under the atmosphere containing the organic substance gases in a manner similar to the energization forming. As a proper organic substance, an aliphatic hydrocarbon class of alkane, alkene, or alkyne, an aromatic hydrocarbon class, an alcohol class, an aldehyde class, a ketone class, an amine class, an organic acid class such as phenol, carvone, or sulfonic acid, or the like can be mentioned. Specifically speaking, saturated hydrocarbon expressed by a composition formula of $C_nH_{2n+2}$ such as methane, ethane, or propane or unsaturated hydrocarbon expressed by a composition formula of $C_nH_{2n}$, or the like such as ethylene or propylene can be used. Benzene, toluene, methanol, ethanol, formaldehyde, acetaldehyde, acetone, methyl ethyl ketone, methylamine, ethylamine, phenol, formic acid, acetic acid, propionic acid, or the like can be also used.

It is desirable that carbon and/or carbon compound is graphite-like carbon. The graphite-like carbon in the invention contains the following carbon: carbon having a crystalline structure of perfect graphite (what is called HOPG); carbon in which a crystal particle size is equal to about 20 nm and a crystalline structure is slightly distorted (PG); carbon in which a crystal particle size is equal to about 2 nm and a crystalline structure is further distorted (GC); or amorphous carbon (which denotes amorphous carbon and/or a mixture of amorphous carbon and a fine crystal of the graphite).

That is, even if a layer distortion such as a grain boundary between the graphite particles or the like exists, the carbon compound can be desirably used. It is desirable that its film thickness is set to a value within a range of 50 nm or less and, much desirably, a range of 30 nm or less.

Figure 4:
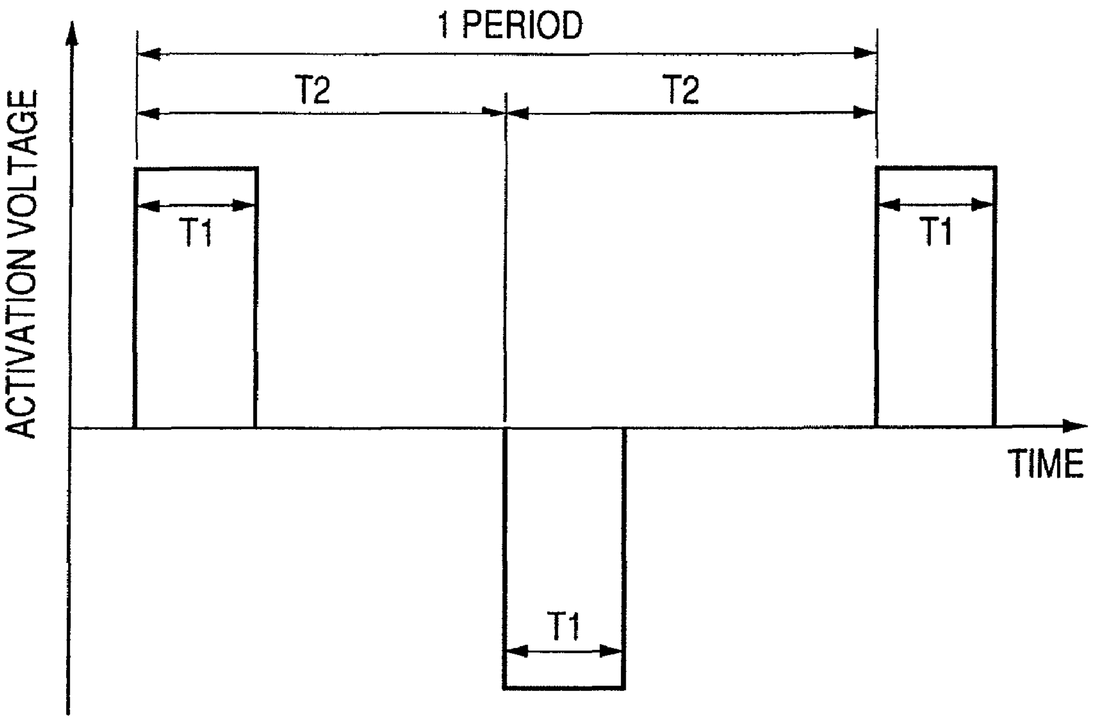
FIG. 4 is a schematic diagram illustrating an example of a pulse voltage which is applied in an activating step of the electron-emitting device of the invention.

It is desirable that the pulse voltage waveform which is used in the activating step is a waveform adapted to reverse a relation between an electric potential of the device electrode 4 or the electroconductive film 6a and an electric potential of the device electrode 5 or the electroconductive film 6b at predetermined timing or at a predetermined period (refer to FIG. 4).

It is desirable to execute a stabilizing step to the electron-emitting device obtained by those steps. This step is a step of evacuating an organic substance in a vacuum chamber. As a vacuum evacuating apparatus for evacuating the inside of the vacuum chamber, it is desirable that an apparatus which does not use oil is used so that the oil generated from the apparatus does not exert an influence on characteristics of the device. Specifically speaking, a vacuum evacuating apparatus such as absorption pump, ion pump, or cryosorption pump can be mentioned.

A partial pressure of the organic component in the vacuum chamber is set to, desirably, $1\times10^{-5}$ Pa or less and, particularly desirably, $1\times10^{-7}$ Pa or less as a partial pressure at which the carbon or carbon compound mentioned above is not almost newly deposited. Further, when evacuating the inside of the vacuum chamber, it is desirable that the whole vacuum chamber is heated, thereby allowing organic substance molecules adsorbed to an inner wall of the vacuum chamber or on the electron-emitting device to be easily evacuated. As heating conditions at this time, it is desirable to execute the process at a temperature within a range from 80 to 400° C. for a time as long as possible. However, the invention is not limited to those conditions but the above process is performed under conditions which are properly selected based on various conditions such as size and shape of the vacuum chamber, construction of the electron-emitting device, and the like. It is necessary to reduce a pressure in the vacuum chamber as low as possible to, desirably, $1\times10^{-5}$ Pa or less and, particularly desirably, $1\times10^{-6}$ Pa or less.

As an atmosphere upon driving after the stabilizing step was executed, it is desirable to maintain the atmosphere at the end of the stabilization operation. However, the invention is not limited to it. When the organic substance has sufficiently been removed, even if a vacuum degree itself decreases slightly, the sufficiently stable characteristics can be maintained.

By adopting such a vacuum atmosphere, the deposition of the new carbon and/or carbon compound can be suppressed, so that the device current If and the emission current Ie are stabilized.

According to the surface conduction electron-emitting device to which the invention is applied, the electron-emitting characteristics can be easily controlled according to an input signal. By using such a nature, the invention can be applied to various fields such as electron source constructed by arranging a plurality of electron-emitting devices, image display apparatus, and the like.

Figure 5:
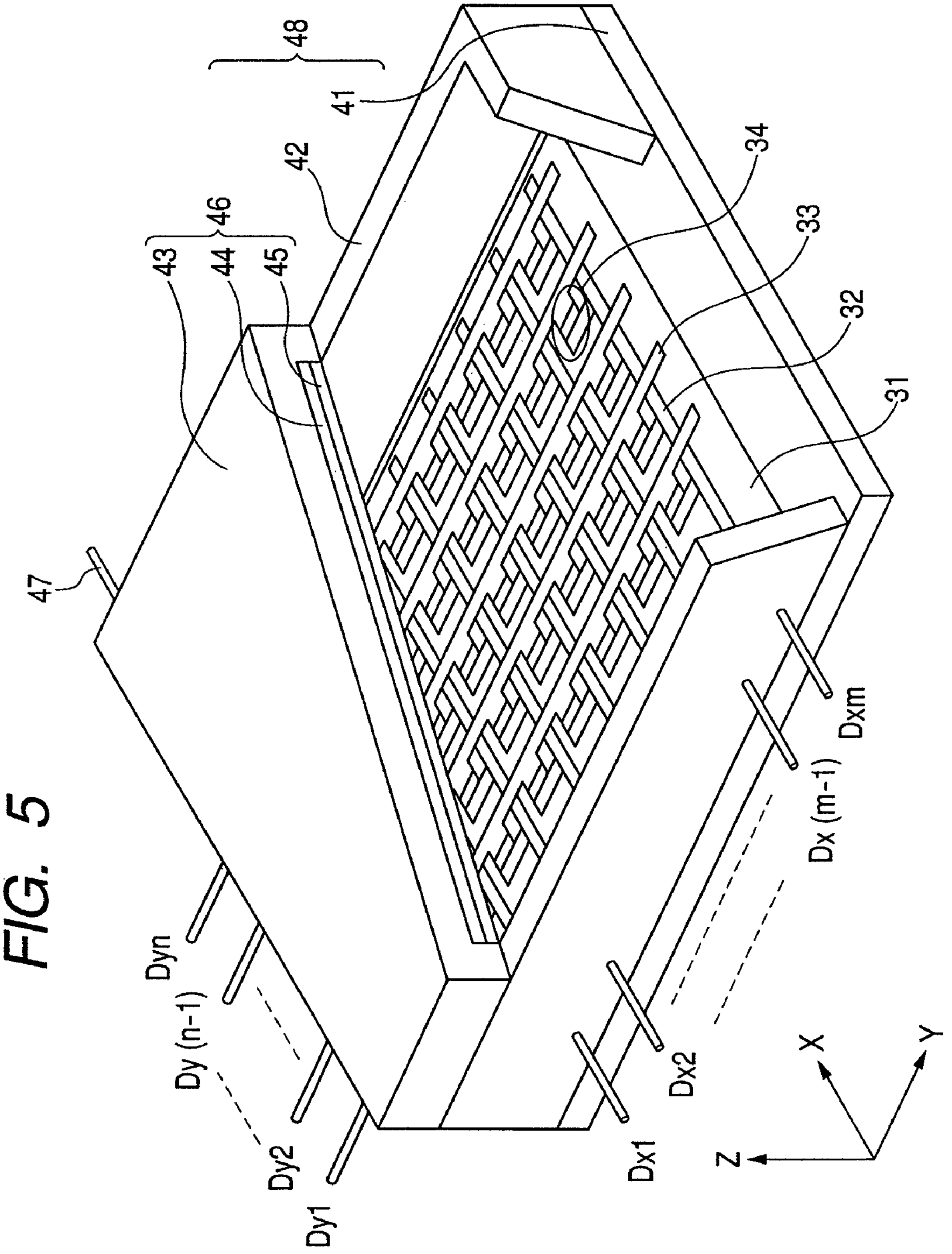
FIG. 5 is a schematic diagram illustrating an example of a display panel of an image display apparatus using the electron-emitting devices of the invention.

FIG. 5 illustrates an example of a display panel of the image display apparatus using the electron source constructed by arranging a plurality of electron-emitting devices 34 of the invention in a matrix form. FIG. 5 is a diagram schematically illustrating a construction of the display panel with a part cut away. An electron source substrate (first substrate) 31 is fixed onto a rear plate 41. A face plate (second substrate) 46 is constructed by forming a phosphor film (image display member) 44, a metal back 45, and the like onto an inner surface of a glass substrate 43. The rear plate 41 and the face plate 46 are connected to a supporting frame 42 by using frit glass or the like. An envelope 48 is constructed by being baked in, for example, the atmosphere or a nitrogen gas in a temperature range from 400 to 500° C. for 10 minutes or longer and being seal-bonded.

The envelope 48 is constructed by the face plate 46, supporting frame 42, and rear plate 41 as mentioned above. Since the rear plate 41 is provided mainly in order to enhance a strength of the substrate 31, if the substrate 31 itself has the enough strength, the rear plate 41 as a separate member can be made unnecessary. That is, the envelope 48 may be constructed by the face plate 46, supporting frame 42, and substrate 31 by directly seal-bonding the supporting frame 42 to the substrate 31. The envelope 48 having the enough strength against the atmospheric pressure can be also constructed by arranging a supporting member (not shown) called a spacer between the face plate 46 and the rear plate 41.

The image display apparatus illustrated in FIG. 5 is manufactured, for example, as follows. In a manner similar to the foregoing stabilizing step, the envelope 48 is evacuated through an exhaust pipe (not shown) by the evacuating apparatus which does not use any oil such as ion pump, absorption pump, turbo pump, or cryosorption pump while properly being heated. After the inside of the envelope 48 was set into the atmosphere in which a vacuum degree is equal to about $10^{-5}$ Pa and an amount of organic substance is sufficiently small, the envelope is sealed. A getter process can be also executed in order to maintain the vacuum degree after sealing the envelope 48. The getter process is such a process that just before or after the envelope 48 is/was sealed, a getter arranged at a predetermined position (not shown) in the envelope 48 is heated by heating using resistance heating, high-frequency heating, or the like, thereby forming an evaporation deposition film. The getter is ordinarily made of Ba or the like as a main component and maintains a vacuum degree in a range, for example, from $1\times10^{-5}$ to $1\times10^{-6}$ Pa by the adsorbing operation of the evaporation deposition film.

In the image display apparatus of the invention which can take such a construction, by applying a voltage to each electron-emitting device through terminals (out of the chamber) $Dx_1$ to $Dx_m$ connected to X-directional wirings 32 and terminals (out of the chamber) $Dy_1$ to $Dy_n$ connected to Y-directional wirings 33, an electron emission occurs. An electron beam is accelerated by applying a high voltage to the metal back 45 through a high-voltage terminal 47. The accelerated electron collides with the phosphor film 44, so that a light emission occurs and an image is formed.

The image display apparatus of the invention can be used as a display apparatus of television broadcasting or a display apparatus of a television conference system, a computer, or the like.

EXAMPLES

The invention will be described in detail hereinbelow by mentioning specific Examples. However, the invention is not limited to those Examples but also incorporates examples obtained by substituting each component element or changing a design within the scope of the invention where the object of the invention is accomplished.

Example 1

The 48 electron-emitting devices with the construction illustrated as an example in FIGS. 1A and 1B are arranged in one column onto one substrate. A producing process of the electron-emitting device will now be described with reference to FIGS. 2A to 2D.

Step-a

A film having a thickness of 0.4 μm obtained by mixing silicon nitride and silicon oxide is formed as an activation suppressing layer 2 onto cleaned soda lime glass by a sputtering method. When film-forming the activation suppressing layer 2 having the thickness of 0.4 μm, the film is divisionally formed four times while changing a nitrogen containing ratio every thickness of 0.1 μm. Mole ratios of nitrogen and oxygen in the four layers of the activation suppressing layer are respectively set to 4:1, 3:2, 2:3, and 1:4 in stacking order.

Further, a silicon oxide film having a thickness of 0.05 μm is formed as an activation accelerating layer 3 by the sputtering method (FIG. 2A).

Step-b

A mask pattern of a photoresist (RD-2000N-41; manufactured by Hitachi Chemical Co., Ltd.) having opening portions corresponding to a pattern of electrodes is formed onto the substrate on which the activation accelerating layer 3 and the like have been formed. A Ti film having a thickness of 5 nm and a Pt film having a thickness of 100 nm are sequentially stacked by the vacuum evaporation depositing method. The photoresist is dissolved by an organic solvent and the Pt/Ti films on the photoresist are lifted off, thereby forming the device electrodes 4 and 5. An interval L between the device electrodes 4 and 5 is equal to 3 μm and an electrode width W is equal to 300 μm (FIG. 2B).

Step-c

A Cr film having a thickness of 100 nm is formed onto the device by the vacuum evaporation depositing method. Opening portions corresponding to a pattern of the electroconductive film 6 are formed by the photolithography technique and a Cr mask adapted to form the electroconductive film is formed. The Cr mask is coated with an organic Pd solution (ccp4230; manufactured by OKUNO CHEMICAL INDUSTRIES CO., LTD) by using a spinner and a baking process is executed in the atmosphere at 300° C. for 10 minutes, thereby forming a fine particle film made by fine particles containing PdO as a main component. A thickness of this film is equal to 10 nm.

Step-d

The Cr mask is removed by wet etching and the PdO fine particle film is lifted off, thereby obtaining the electroconductive film 6 of a desired shape. A resistance value of the electroconductive film is equal to $Rs=2\times10^4\Omega/\square$ (FIG. 2C).

Step-e

The substrate 10 is set into the vacuum chamber. The inside of the vacuum chamber is evacuated so that a pressure reaches $1.3\times10^{-3}$ Pa. What is called an evacuating apparatus for a high vacuum constructed by a turbo pump and a rotary pump is used here as an evacuating apparatus. The evacuating apparatus further has an ion pump for a super-high vacuum besides those pumps and they can be properly switched and used.

A pulse voltage is applied to each device and the forming operation is executed, thereby forming electron-emitting regions. A waveform of the pulse voltage which is used in this instance is a triangular wave pulse whose peak value is increased/decreased as illustrated in FIG. 3. A pulse width is set to T1=1 msec and a pulse interval is set to T2=10 msec. During the forming operation, a resistance measuring pulse of 0.1V is inserted in a rest time of a forming pulse. When the resistance value exceeds 1 MΩ, the forming operation is finished. The peak value of the pulse at the end of the forming operation is equal to 5.0 to 5.1 V. A pressure in the vacuum chamber at this time is equal to $2.7\times10^{-4}$ Pa (FIG. 2D).

Step-f

Subsequently, the activating step is executed.

After the inside of the vacuum chamber was temporarily evacuated to about $10^{-6}$ Pa by the ion pump, acetone is introduced and the pressure is adjusted to $2.7\times10^{-1}$ Pa. A pulse illustrated in FIG. 4 is used as a pulse which is applied to the device. In FIG. 4, rectangular wave pulses having polarities which are mutually in the opposite directions are used. Pulse widths of those pulses of those polarities are equal to T1=1 msec and an interval between the pulses is equal to T2=10 msec. Therefore, one period is set to 20 msec and a frequency is set to 50 Hz. A pulse peak value Vact is equal to 10V at the beginning and is controlled so as to rise at a rate of 0.2 V/min and reach 18V.

Step-g

Finally, the stabilization operation is executed at 250° C. for 12 hours in the vacuum of $10^{-5}$ Pa.

After that, a triangular wave pulse of 5V is applied and a leakage current is measured, so that a mean value of the leakage currents of the 48 electron-emitting devices is equal to 3.1 μA. A triangular wave pulse of 16V is applied and electron-emitting characteristics are measured. The pressure in the vacuum chamber is equal to $1.3\times10^{-6}$ Pa, a distance between the anode electrode and the electron-emitting device is set to 4 mm, and an electric potential difference is set to 1 kV. A variation in emission currents of the 48 electron-emitting devices is equal to 4%.

(Comparison 1)

A silicon nitride film having a thickness of 0.4 μm is formed as an activation suppressing layer 2 onto the soda lime glass substrate. Thereafter, a silicon oxide film having a thickness of 0.05 μm is formed as an activation accelerating layer 3 onto the layer 2. Other producing steps are similar to those of Example 1 and an electron-emitting device is formed. In this case, a mean value of the leakage currents of the 48 electron-emitting devices is equal to 14.8 μA. The electron-emitting characteristics are measured by a method similar to that of Example 1, so that a variation in emission currents of the 48 electron-emitting devices is equal to 5%.

Example 2

48 surface conduction electron-emitting devices are produced in a method similar to that of Example 1 except that a film obtained by mixing an aluminum nitride and a silicon oxide is deposited as an activation suppressing layer 2 by the vacuum evaporation depositing method. The film of the activation suppressing layer 2 is divisionally formed four times while changing the nitrogen containing ratio every thickness of 0.1 μm so that the thickness reaches 0.4 μm. Mole ratios of nitrogen and oxygen in the four layers of the activation suppressing layer 2 are respectively set to 4:1, 3:2, 2:3, and 1:4 in stacking order. In this case, a mean value of the leakage currents of the 48 electron-emitting devices is equal to 6.3 μA. Electron-emitting characteristics are measured by the same method as that of Example 1, so that a variation in emission currents of the 48 electron-emitting devices is equal to 5%.

Example 3

48 surface conduction electron-emitting devices are produced in a method similar to that of Example 1 except that a film obtained by mixing a silicon nitride and a silicon oxide is deposited as an activation suppressing layer 2 by a plasma CVD method.

In this case, a mean value of the leakage currents of the 48 electron-emitting devices is equal to 3.4 μA. Electron-emitting characteristics are measured by a method similar to that of Example 1, so that a variation in emission currents of the 48 electron-emitting devices is equal to 5%. As described above, according to results of Examples 1 to 3 having distribution in the nitrogen containing ratio of the activation suppressing layer 2 of the invention, the leakage current of the electron-emitting device is small as compared with the result of Comparison 1 which does not have distribution in the nitrogen containing ratio of the activation suppressing layer 2.

Although above Examples have been described with respect to the example in which the silicon nitride and aluminum nitride are contained in the activation suppressing layer 2, the electron-emitting device in which the leakage current is smaller than that of Comparison can be also similarly formed even in the case of the example in which the tantalum nitride and the like are contained as mentioned in the description of the embodiments.

Example 4

A silicon nitride film having a thickness of 0.1 μm is formed as an activation suppressing layer 2 onto the soda lime glass substrate. Subsequently, a layer having a thickness of 0.3 μm obtained by mixing a silicon nitride and a silicon oxide so that a mole ratio of nitrogen and oxygen is equal to 1:1 is formed. Further, a silicon oxide film having a thickness of 0.05 μm is formed as an activation accelerating layer 3. Other producing steps are similar to those of Example 1 and 48 electron-emitting devices are formed. In this case, a mean value of the leakage currents of the 48 electron-emitting devices is equal to 8.9 μA. The electron-emitting characteristics are measured by a method similar to that of Example 1, so that a variation in emission currents of the 48 electron-emitting devices is equal to 5%.

Example 5

In this Example, an electron source in which a plurality of surface conduction electron-emitting devices are arranged onto the substrate and wired in a matrix form and an image display apparatus using the electron source are produced by steps illustrated in FIGS. 6A to 6E and 7A to 7D.

Step-A

Figure 6A:
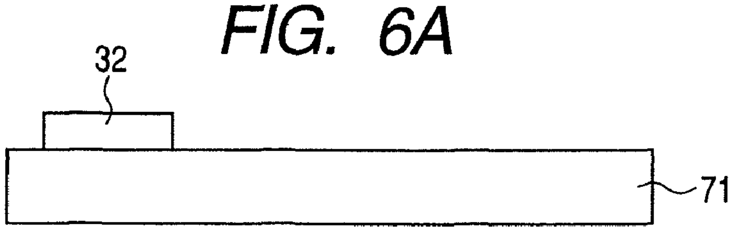
FIGS. 6A, 6B, 6C, 6D, and 6E are schematic diagrams illustrating producing steps of the image display apparatus of the embodiment.

A Cr film having a thickness of 5 nm and an Au film having a thickness of 600 nm are sequentially stacked onto cleaned soda lime glass 71 by the vacuum evaporation depositing method. Thereafter, a surface of the stacked layers is spin-coated with a photoresist (AZ1370; manufactured by Hoechst Japan Ltd.) by a spinner. The photoresist is baked and, subsequently, a photomask image is exposed and developed, thereby forming a wiring pattern. The Au/Cr deposition films are wet-etched, thereby forming the X-directional wirings 32 of a desired shape (FIG. 6A).

Step-B

Figure 6B:
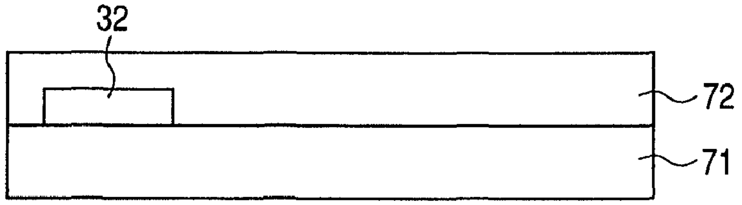

An interlayer insulating layer 72 made of a silicon oxide film having a thickness of 1.0 μm is deposited by an RF sputtering method (FIG. 6B).

Step-C

Figure 6C:
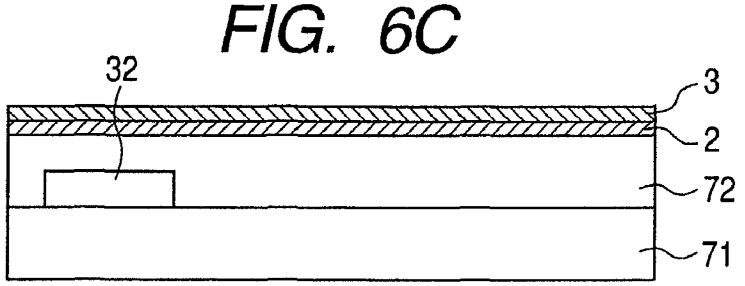

A film having a thickness of 0.4 μm obtained by mixing silicon nitride and silicon oxide is divisionally formed four times as an activation suppressing layer 2 onto the interlayer insulating layer 72 by the RF sputtering method while changing the nitrogen containing ratio every thickness of 0.1 μm. Mole ratios of nitrogen and oxygen in the four layers of the activation suppressing layer are respectively set to 4:1, 3:2, 2:3, and 1:4 in stacking order. Further, a silicon oxide film having a thickness of 0.05 μm is formed as an activation accelerating layer 3 by the RF sputtering method (FIG. 6C).

Step-D

Figure 6D:
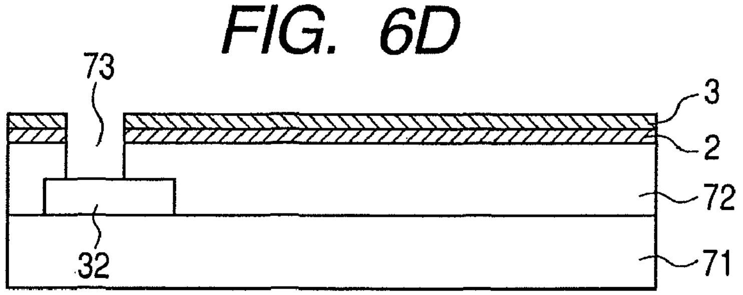

A photoresist pattern to form a contact hole 73 into the activation accelerating layer 3, the activation suppressing layer 2 and the interlayer insulating layer 72 deposited in step-B and step-C is formed. The activation accelerating layer 3, the activation suppressing layer 2 and the interlayer insulating layer 72 is etched by using the photoresist pattern as a mask, thereby forming the contact hole 73. The etching is executed by an RIE (Reactive Ion Etching) method using $CF_4$ and $H_2$ gases (FIG. 6D).

Step-E

Figure 6E:
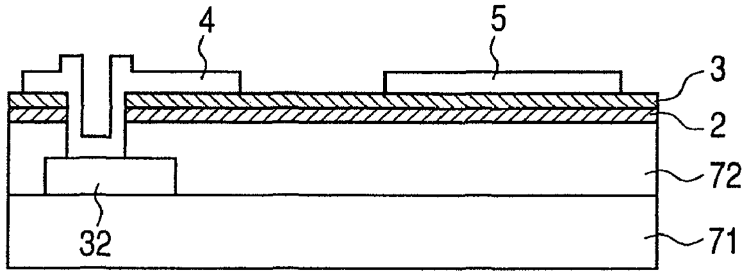

After that, a pattern to form the device electrodes 4 and 5 is formed by a photoresist (RD-2000N-41; manufactured by Hitachi Chemical Co., Ltd.) and a Ti film having a thickness of 5 nm and an Ni film having a thickness of 100 nm are sequentially deposited by the vacuum evaporation depositing method. The photoresist pattern is dissolved by the organic solvent and the Ni/Ti deposition films are lifted off, thereby forming the device electrodes 4 and 5 in which the interval L between the device electrodes is equal to 3 μm and the width W is equal to 300 μm (FIG. 6E).

Step-F

Figure 7A:
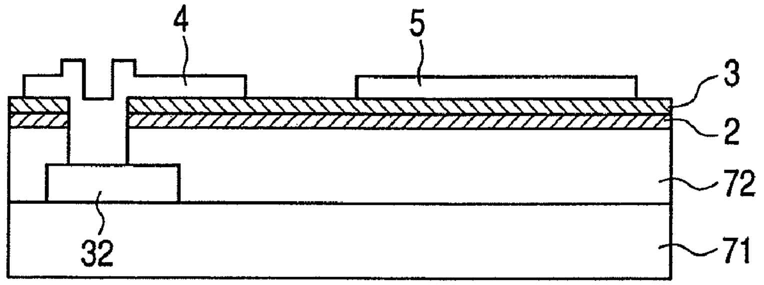
FIGS. 7A, 7B, 7C, and 7D are schematic diagrams illustrating producing steps of the image display apparatus of the embodiment.

A resist pattern is formed on portions other than the portion of the contact hole 73. A Ti film having a thickness of 5 nm and an Au film having a thickness of 500 nm are sequentially deposited by the vacuum evaporation deposition. The unnecessary portions are removed by the lift-off and the contact hole 73 is embedded (FIG. 7A).

Step-G

Figure 7B:
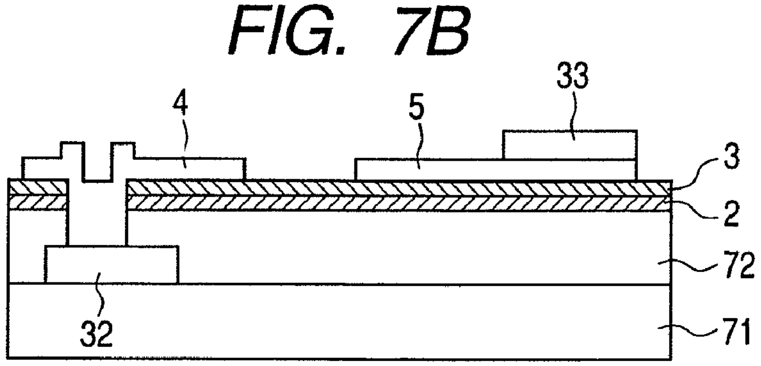

A photoresist pattern of the Y-directional wirings 33 is formed onto the device electrodes 4 and 5. After that, a Ti film having a thickness of 5 nm and an Au film having a thickness of 500 nm are sequentially deposited by the vacuum evaporation deposition. The unnecessary portions are removed by the lift-off and the Y-directional wirings 33 of a desired shape are formed (FIG. 7B).

Step-H

Figure 7C:
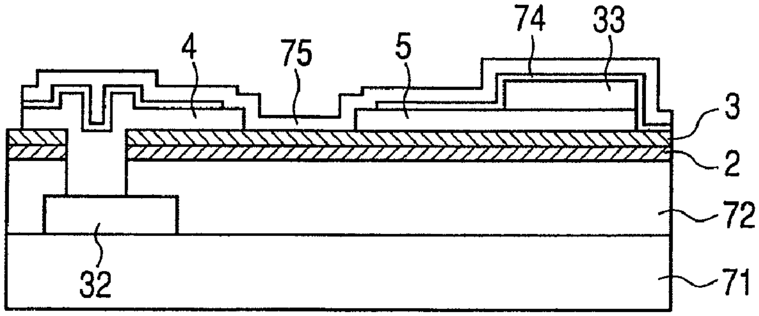

A Cr film 74 having a thickness of 30 nm is deposited by the vacuum evaporation deposition and patterned so as to have an opening portion of the shape of the electroconductive film 6. Subsequently, the surface is spin-coated with a Pd amine complex solution (ccp4230) by a spinner and a heat baking process is executed at 300° C. for 12 minutes, thereby forming a PdO fine particle film 75. A thickness of film 75 is equal to 70 nm (FIG. 7C).

Step-I

Figure 7D:
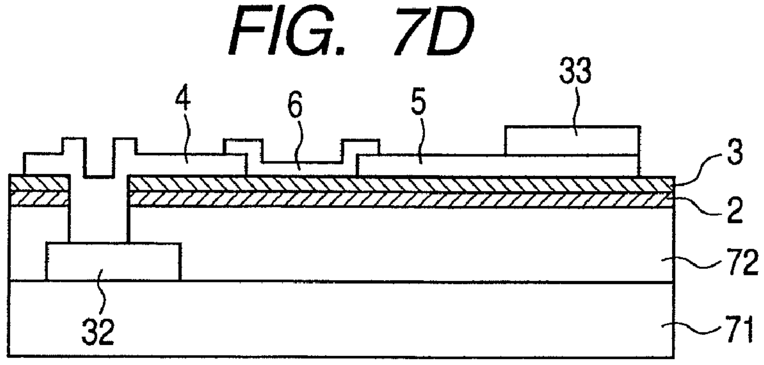

The Cr film 74 is wet-etched by using an etchant and removed together with the unnecessary portion of the PdO fine particle film 75, thereby forming the electroconductive film 6 of a desired shape. A resistance value is equal to about $Rs=4\times10^4\Omega/\square$ (FIG. 7D).

Step-J

After the electron source substrate 31 obtained by step-A to step-I was fixed onto the rear plate 41 before the energization forming, the face plate 46 is arranged to a portion that is over the substrate 31 by 5 mm through the supporting frame 42. Subsequently, joint portions of the face plate 46, supporting frame 42, and rear plate 41 are coated with frit glass and they are baked in the atmosphere at 400° C. for 10 minutes, thereby seal-bonding them. The substrate 31 is fixed to the rear plate 41 also by the frit glass.

In this Example, a stripe shape is used as a shape of a phosphor material of the face plate 46. First, black stripes are formed. Subsequently, gap portions among the black stripes are coated with color phosphor materials, thereby forming the phosphor film 44. A material containing graphite as a main component which is ordinarily often used is used as a material of the black stripes. A slurry method is used as a method of coating the glass substrate 43 with the phosphor material.

After the phosphor film 44 was formed, a smoothing process (which is ordinarily called filming) is executed to the inner surface side of the phosphor film 44. After that, the metal back 45 is formed by vacuum evaporation depositing an Al film.

Although there is also a case where for the face plate 46, a transparent electrode (not shown) is provided on the outer surface side of the phosphor film 44 in order to further improve the conductivity of the phosphor film 44, in the embodiment, since the sufficient conductivity can be obtained only by the metal back 45, such a transparent electrode is omitted.

When the seal-bonding mentioned above is executed, in case of a color display, since each color phosphor material and the electron-emitting device have to be made correspond to each other, sufficient position matching is performed.

Step-K

The atmosphere in the glass chamber completed as mentioned above is evacuated to a vacuum degree of about $10^{-4}$ Pa by a vacuum pump through the exhaust pipe (not shown). The Y-directional wirings 33 are coupled in common and the forming operation is executed every line. The forming is executed under the conditions used in Example 1.

Step-L

Subsequently, the activation operation is executed. The exhaust pipe is connected to an ampoule filled with acetone serving as an activating substance. Acetone is introduced into the panel. The pressure is adjusted so that it reaches $1.3\times10^{-1}$ Pa. A rectangular wave pulse of 18V is applied. The pulse width is set to 100 μsec and the pulse interval is set to 20 msec.

The activation operation is executed row by row. The rectangular wave pulse whose peak value is equal to Vact=18V is applied to one X-directional wiring 32 connected to the devices of one row. The Y-directional wirings 33 are coupled in common in a manner similar to step-K.

The pulse is changed into a triangular wave every minute and If-Vf characteristics are measured. If a value of If at Vf2=Vact/2=9V satisfies If(Vf2)≧If(Vact)/220, the peak value of the rectangular wave pulse is raised to 19V for 30 seconds. After that, it is returned to 18V and the activation operation is continued.

When the device current per device reaches If(18V)≧2 mA, the activation of the relevant row is finished, the activation operation of the next row is executed, and similar processes are repeated.

Step-M

When the activation of all rows is finished, a valve of a gas introducing apparatus is closed, the introduction of acetone is stopped, and the evacuation is continued for 5 hours while heating the whole glass panel to about 200° C. Subsequently, electrons are emitted by a passive matrix driving and the phosphor film 44 is allowed to perform the light emission from the whole surface. After confirming that the phosphor film 44 operated normally, the exhaust pipe is seal-bonded by heating and is fully sealed. After that, the getter (not shown) put in the panel is flashed by the high-frequency heating.

By the above steps, the image display apparatus having a practically sufficient brightness can be produced and the leakage current at 5V of each electron-emitting device is suppressed to 7 μA or less. The luminance variation is equal to 12% or less.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-126628, filed May 14, 2008, which is hereby incorporated by reference herein in its entirety.

What is claimed is:

1. An electron-emitting device comprising at least:

a pair of device electrodes formed on a substrate; and an electroconductive film formed on the substrate so as to connect the device electrodes, wherein the electroconductive film has a first gap between the device electrodes and has a carbon film having a second gap at least in the first gap, the substrate is constructed by stacking a base, an activation suppressing layer containing nitrogen, and an activation accelerating layer whose nitrogen containing ratio is smaller than that of the activation suppressing layer, in order, the pair of device electrodes and the electroconductive film are disposed on the activation accelerating layer, the substrate has distribution of the nitrogen containing ratio in the activation suppressing layer in a film thickness direction, and the nitrogen containing ratio of the activation suppressing layer at the activation accelerating layer side is smaller than that at the base side.

2. A device according to claim 1, wherein the activation suppressing layer contains one of silicon nitride, aluminum nitride, and tantalum nitride.

3. A device according to claim 1, wherein the activation accelerating layer is made of $SiO_2$ or glass containing $SiO_2$ as a main component.

4. An image display apparatus in which a first substrate on which the plurality of electron-emitting devices according to claim 1 are arranged and a second substrate on which image display members to which electrons emitted from the electron-emitting devices are irradiated are arranged in opposition to the electron-emitting devices are arranged so as to face each other.

5. An electron-emitting device comprising at least:

a pair of device electrodes formed on a substrate; and an electroconductive film formed on the substrate so as to connect the device electrodes, wherein the electroconductive film has a first gap between the device electrodes and has a carbon film having a second gap at least in the first gap, the substrate is constructed by stacking a base, a first layer containing nitrogen, and a second layer whose nitrogen containing ratio is smaller than that of the first layer, in due order, the pair of the device electrodes and the electroconductive film are disposed on the second layer, the substrate has distribution of the nitrogen containing ratio in the first layer in a film thickness direction, and the nitrogen containing ratio of the first layer at the second layer side is smaller than that at the base side.

6. The electron-emitting device according to claim 5, wherein the first layer contains one of silicon nitride, aluminum nitride, and tantalum nitride.

7. The electron-emitting device according to claim 5, wherein the second layer is made of $SiO_2$ or glass containing $SiO_2$ as a main component.

8. An image display apparatus in which a first substrate on which the plurality of electron-emitting devices according to claim 5 are arranged and a second substrate on which image display members to which electrons emitted from the electron-emitting devices are irradiated are arranged in opposition to the electron-emitting devices are arranged so as to face each other.

* * * * *